United States Patent [19]

Stoddard

[11] Patent Number: 4,838,656
[45] Date of Patent: Jun. 13, 1989

[54] TRANSPARENT ELECTRODE FABRICATION

[75] Inventor: Darrell Stoddard, Malibu, Calif.

[73] Assignee: Andus Corporation, Canoga Park, Calif.

[21] Appl. No.: 211,107

[22] Filed: Jun. 21, 1988

Related U.S. Application Data

[63] Continuation of Ser. No. 915,355, Oct. 6, 1980, abandoned.

[51] Int. Cl.[4] .............................. C23F 1/02; G02F 1/3; B44C 1/22
[52] U.S. Cl. ..................................... 350/336; 156/652; 156/656; 156/659.1; 156/667; 350/333; 428/1
[58] Field of Search ......................... 437/181; 340/784; 252/79.1, 79.2, 79.5; 428/1; 156/652, 654, 655, 656, 659.1, 664–667; 350/330, 333, 336, 350 R; 357/4, 25, 32

[56] References Cited

U.S. PATENT DOCUMENTS

| | | | |
|---|---|---|---|
| 2,730,598 | 1/1956 | Lytle | 437/181 X |
| 3,863,332 | 2/1975 | Leupp et al. | 156/656 |
| 3,928,658 | 12/1975 | Van Boxtel | 156/656 X |
| 3,956,042 | 10/1976 | Thornburg et al. | 357/2 X |
| 4,149,885 | 4/1979 | Luo et al. | 156/656 X |
| 4,232,059 | 11/1980 | Proffitt | 156/656 X |
| 4,234,654 | 11/1980 | Yatabe et al. | 428/333 |
| 4,326,929 | 11/1982 | Minezaki et al. | 204/15 |
| 4,331,758 | 5/1982 | Luo | 156/649 X |
| 4,336,295 | 6/1982 | Smith | 156/667 X |
| 4,523,811 | 1/1985 | Ota | 350/333 |

FOREIGN PATENT DOCUMENTS 3409420 9/1985 Fed. Rep. of Germany .
85-243240/40 9/1985 World Int. Prop. O. .

OTHER PUBLICATIONS

Pat. Abs. Jap., vol. 9, No. 154, p. 126 E 325, (1985), (abstract of JP Kokai 60-35,445).

Primary Examiner—William A. Powell
Attorney, Agent, or Firm—Yuan Chao; Herbert G. Burkard

[57] ABSTRACT

A panel for a liquid crystal or other visual display is formed by depositing onto a transparent backing a transparent conductive material, such as indium-tin oxide, and then a metal such as nickel that will serve as a bus to power the transparent conductive material. The nickel is first etched to a bus configuration, and then the indium-tin oxide is etched to produce one or more picture elements.

17 Claims, 2 Drawing Sheets

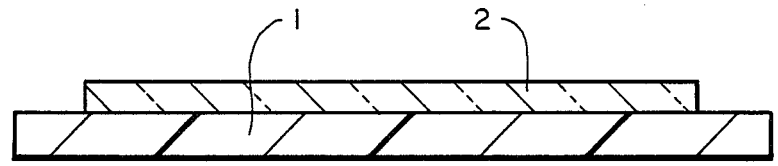
FIG_1
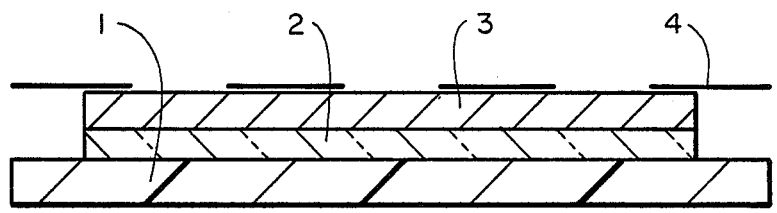
FIG_2
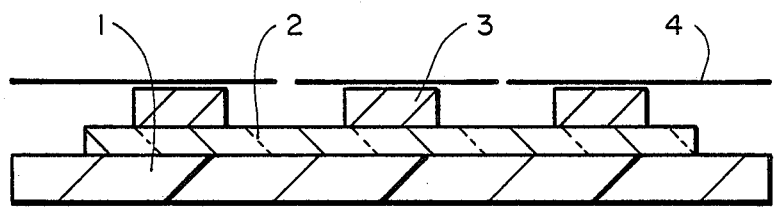
FIG_3
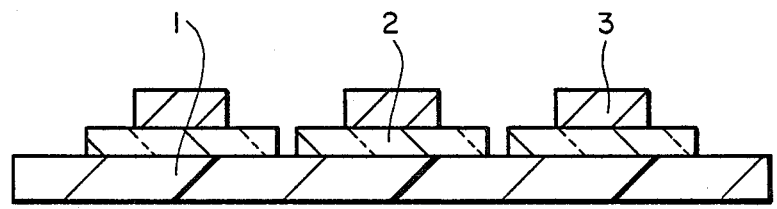
FIG_4

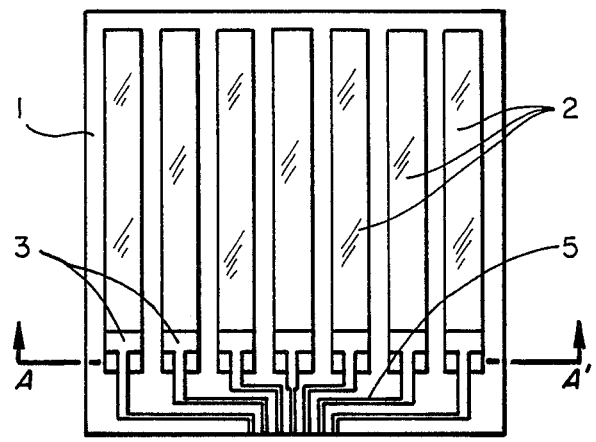
FIG_5
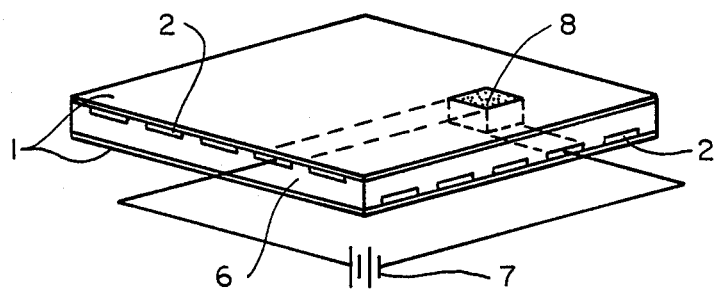
FIG_6
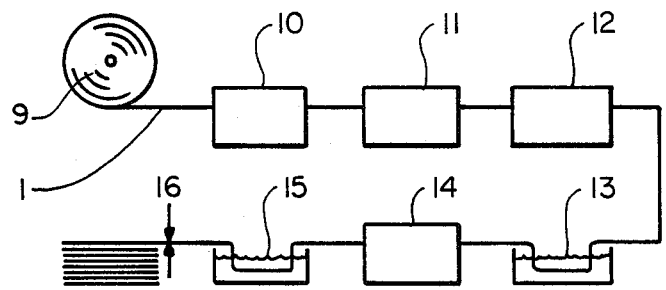
FIG_7

TRANSPARENT ELECTRODE FABRICATION

This application is a continuation of application Ser. No. 915,355 filed Oct. 6, 1986, now abandoned.

BACKGROUND OF THE INVENTION

The invention relates to a transparent electrode, for example a panel for a liquid crystal or touch-sensitive or other visual display. In general, a liquid crystal display will comprise two such panels with a liquid crystal therebetween. The function of the panels is to apply an electric field across the liquid crystal, thereby causing a change in its reflectivity or other optical properties. One such panel will need to be transparent in order that the change in, for example, reflectivity be viewed and it is with such a panel that the invention is concerned. The other panel may also be transparent.

The panel must be able to be connected (which includes capacitive connection) to a voltage source and may have elements of a shape corresponding to the information that is to be displayed. In general the elements will comprise a plurality of cells, generally substantially rectangular for example square, that can be powered in a variety of combinations to produce the outline of letters and numbers etc. Another type of display acts as a shutter, allowing information behind it to be selectively viewed. The elements may comprise a conductive transparent material, such as indium-tin oxide (represented as ITO, but generally having the composition $In_2O_3$ plus $SnO_2$) that are connectable to the voltage source via a conductive metal bus. Such bussing is generally necessary due to the difficulty of making a transparent material of sufficiently high electrical conductivity to avoid undesirable voltage drop along the leads that supply the elements with power.

The standard prior art method of making such a structure is to apply a silver loaded ink to a panel using a silk-screening process, after which the ink is cured by heating. The conductive silver is thus applied in the pattern desired in the finished product. There are, however, several disadvantages inherent in this method. Firstly, the heat curing step is inconvenient and limits the choice of backing to which the ITO is applied to materials that can withstand high temperatures. Secondly, silver inks applied by this method adhere poorly to ITO. a third disadvantage is that the size of the conductive interconnections is limited using the silk-screening technique. A fourth disadvantage is that conductive silver inks do not have high conductivity unless they are thick. Also, chemical stability of such silver plus organic binder paints may be insufficient.

We have discovered that the disadvantages of the prior art can be overcome using a simple etching process. Whilst etching is known in general in the context of liquid crystal displays, see for example U.S. Pat. No. 4,523,811 to Ota, a satisfactory two step deposition followed by an etching process has not been disclosed for the production of bussed transparent conductive elements. U.S. Pat. No. 4,523,811 is concerned with the production of non-linear, metal-insulator-metal, structures that are located at and used to control individual display elements based on glass substrates, the intention being to increase the display capacity of the liquid crystal device by means of active multiplexing. The pixels, or elements, are thus very small. Various selective etching techniques are disclosed to produce the non-linear metal-insulator-metal structures.

SUMMARY OF THE INVENTION

The invention provides a method of producing a transparent electrode, which comprises:
 (a) applying a transparent conductive material to a transparent thin film substrate;
 (b) applying a metal to the transparent conductive material;
 (c) then etching the metal to form one or more busses; and
 (d) optionally etching the transparent conductive material to form one or more elements connected to one or more of said busses.

The invention further provides a method of producing a transparent electrode which method comprises:
 (a) applying a transparent conductive material to a transparent substrate;
 (b) applying a metal to the transparent conductive material;
 (c) then selectively etching the metal to form one or more busses; and
 (d) before or after step (c), etching the transparent conductive material to form one or more elements connected to one or more of said busses.

The invention still further provides a method of producing a transparent electrode, having one or more elements each of area at least 5 $mm^2$, which comprises:
 (a) applying a transparent conductive material to a transparent substrate to form one or more elements of area of at least 5 $mm^2$;
 (b) applying a metal to the transparent conductive material; and
 (c) etching the metal to form one or more busses connected to the element or elements.

A single resist may be used (different etchants may still be used, sequentially if appropriate) to etch both the transparent conductive layer and the metal to a common pattern. This may usefully be done over regions of intricate shape, for exampe where fine bussing lines are to be provided. Thereafter, the process may be simplified; the metal may be removed from those remaining portions of the transparent conductive layer that are to be viewed, by removing a portion of a resist of simple shape, since it simply need cover all of the bussing lines, which may for example all be positioned together at an edge of the substrate.

The invention also provides an electrode produced by each of the above methods.

The invention also provides transparent electrode, for example a visual display, which comprises an electrode of the invention, a panel, and a liquid crystal material therebetween. The panel may also be an electrode of the invention, although it need not be. In particular, it need not be transparent. The invention is particularly useful for producing an array of said electrodes.

The various deposition and/or etching steps may be carried out as a continuous in-line process, for example for manufacture of rolls of suitably coated polymeric substrate.

The invention is of primary use in connection with liquid crystal displays, but may also find use in other instances where an electric current or potential is to be fed to or drained from a transparent coating for example membrane switches such as touch screen panels and EMI/RFI shields, and visual displays such as electroluminescent displays.

BRIEF DESCRIPTION OF THE DRAWINGS

The invention is further illustrated by the accompanying drawings, in which:

FIG. 1 shows in cross-section a transparent backing to which a transparent conductive material has been applied;

FIG. 2 shows the backing after the additional application of a metal layer;

FIG. 3 shows the result after a first etching;

FIG. 4 shows the result after a second etching;

FIG. 5 is a plan view corresponding to FIG. 4;

FIG. 6 shows a liquid crystal display; and

FIG. 7 shows a schematic processing line.

DESCRIPTION OF PREFERRED EMBODIMENTS

We prefer that the substrate or backing comprises a polymeric film preferably flexible, and preferably thin, for example of thickness 2–1000, more preferably 25–200, especially 50–100 micrometers, The polymeric substrate may be a polyester, or, where a non-birefringent material is required, a uniaxially oriented polyester, a polyethersulphone, polycarbonate or a polyetherimide film. Such a substrate may also include a polarizer. Polymeric substrates are particularly preferred for touch sensitive transparent membrane switches, since the front electrode must be deformed to make contact with another electrode. The present invention may be carried out at low temperatures and thus allows the use of substrates that may be damaged at the high temperatures used in many prior art processes. A continuous, as opposed to batch process, may be particularly useful in this regard since feedback may allow the method to be critically controlled if desired. The conductive transparent material preferably comprises an indium tin oxide (ITO) which may conveniently be applied by a vacuum deposition process such a sputtering. Such a technique may also be used to apply the metal, which is preferably nickel.

In general, in one sputtering technique, predominantly neutral molecular or atomic species are ejected from a target, which may be formed from the material to be deposited, under the bombardment of inert gas positive ions, eg. argon ions. The molecules (or atoms) ejected are deposited on the substrate (or ITO or other transparent conductive layer) which may pass continuously past the target, generally in a medium vacuum of about $10^{-3}$ mbar. The plasma of positive ions required for bombardment may be generated in a glow discharge where the sputtering target serves as the cathode to the glow discharge system. Since the target will in general be an electrically conductive material DC power may be applied. Control of the deposition process is readily achieved, and excellent adhesion to the substrate can be achieved.

One may prefer to employ a magnetron sputtering process, which concentrates the plasma immediately in front of the cathode target by means of a magnetic field. The effect of the magnetic field on the gas discharge is dramatic. In that area of discharge where magnets, usually installed behind the cathode, create a sufficiently strong magnetic field perpendicular to the electric field, secondary electrons resulting from the sputter bombardment process will be deflected by means of the Lorenz force into a circular or helical pattern. Thus the density of electrons immediately in front of the cathode as well as the number of ionized argon atoms bombarding the cathode are substantially increased. Because of this concentration of the plasma a considerable increase occurs in the deposition rate. Bias sputtering (or sputter ion plating) may be employed as a variation of this technique.

In the case of the indium-tin oxide, the preferred technique is a reactive sputtering method in which a reactive gas (in this case oxygen) is introduced into the vacuum chamber in addition to the argon so that the oxide of the target material (in this case indium and tin, preferably in predetermined proportions) will be deposited. The level of the reactive gas and its admission rate have an effect on the electrical and optical properties of the coating, and we prefer that the partial pressure of oxygen be from about 1.0 to 2.0 $\times 10^{-3}$ mbar.

We have found that a nickel or other metal layer applied by vacuum deposition, especially by sputtering, is highly adherent to the underlying ITO or other transparent conductor, has a satisfactory low volume resistivity and is easily soldered or otherwise connected to external power leads.

Any suitable material may be used for the transparent conductive layer, but we prefer indium-tin oxide, or a multi-layer of transparent gold overcoated with an antireflection layer such as tin oxide. The material is preferably deposited to a thickness of 20–150 nm.

The resistivity of the deposited material is preferably less than $10^{-3}$ ohm cm, in the case of indium-tin oxide.

The metal deposited to form the bus may be any of suitable resistivity, eg. less than 20 micro ohm cm, and we prefer nickel, copper, gold, silver or aluminum. The metal is preferably deposited to a thickness of 75–150 nm, especially about 100 nm, depending on the bus resistance required.

In a preferred configuration for liquid crystal displays, the substrate (or a repeating portion of it; the substrate may be produced and supplied in roll form) has a series of spaced apart rows of ITO each being connected to an external power source. A liquid crystal display is formed from such a substrate and another (which need not be transparent) arranged parallel to it, but rotated through 90°. A membrane switch may be similar, but without the liquid crystal. As a result the spaced apart rows of one substrate are overlaid with a series of spaced apart columns of the other substrate, the rows and columns being perpendicular to one another. A liquid crystal material is placed between the two substrates. Application of a voltage between one row and one column, via their respective busses, will cause activation of that cell of liquid crystal that lies at the overlap between the relevant row and column. It can be seen that information can be displayed by activating selected rows and columns or combinations of rows and columns.

The particular etching techniques chosen for selective removal of the transparent conductive layer and of the metal layer will depend on the chemical nature of these layers and of the substrate, and of any resist used. In general, what is desired is that the metal layer can be masked by applying a resist such that parts of it may be removed leaving behind metal traces required to carry out their functions as buses. This should occur with or without substantial removal of the underlying transparent conductive layer. Then, a further resist may be applied such that the transparent conductive layer may be selectively removed in a different pattern to provide elements of the desired shape (spaced apart rows or columns in the example above). This should occur without substantial damage to the metal bus that remains.

The metal, in the case of nickel and copper at least, may be etched using an aqueous solution, generally about 2–8% especially about 5% by weight, of ferric chloride. A suitable etching time is 20–40, especially about 30 seconds.

A preferred etchant for gold is a 1–5%, especially about 3% by weight aqueous solution of potassium iodide/iodine solution. Etching generally takes from 30–90, especially about 60 seconds.

For aluminum we prefer an aqueous solution of sodium hydroxide, preferably of pH 9–10, especially about 10. An etching time of 30–60, especially about 45 seconds is typical.

Removal of selected regions of the transparent conductive layer is conveniently carried out using an acid, such as $H_2SO_4$.

FIGS. 1–4 of the drawings show various method steps of the invention. In FIG. 1 a substrate material 1 such as a polyester, for example polyethylene terephthalate, is provided with a layer of a transparent conductive material 2 such as indium tin oxide. The layer 2 is preferably provided by sputtering. The vertical dimension as drawn has been magnified for clarity.

In FIG. 2 a layer 3 of a metal such as nickel has been added again preferably by sputtering. A resist 4 is shown in position ready for a selective etching operation for partial removal of some of the nickel layer 3.

FIG. 3 shows the situation after this partial etching, and with a second resist 4 in position for selective etching of the transparent conductive layer 2 to form separate elements. The resulting product is shown in FIG. 4.

FIG. 5 shows a plan view of a panel or array produced by the method of the invention. FIG. 4 is equivalent to a cross-section taken along line A–A', although a different number of elements 2 is shown.

The function of the panel as one side of a liquid crystal display can be seen from FIGS. 5 and 6. The conductive transparent elements 2 can be seen in FIG. 5 to be powered through the nickel busses 3 which terminate on leads 5 at the edge of the panel, for easy connection, eg. by soldering to an external power source. FIG. 6 shows two panels, one either side of a liquid crystal material 6. A voltage is shown applied by means of a battery 7 between a picture element of the top and of the bottom panels. The result is that a small area 8 of the liquid crystal material 6 is subjected to an electric field, changing its optical properties as indicated. The areas 8, which may be referred to as pixels (picture elements), are preferably of area at least 5 mm$^2$, especially at least 24 mm$^2$, particularly at least 30 mm$^2$, for example from 30 mm$^2$ to 100 cm$^2$. In general they will be square, but other shapes are possible.

Any suitable means may be provided for selectively powering various pairs of pixels to display the desired information. For example time-division multiplexing may be used where, say, the column picture elements of, say, the top panel are connected to the source of power in rapid succession; the rows on the lower panel appropriate to each column connection being connected to the source of power when that column is connected. If the sequential connection is rapid enough, the eye will perceive a single static display.

FIG. 7 shows schematically a continuous process for making discrete panels from roll 9 of backing material 1. Any two or more sequential steps may be taken, and the remaining steps if desired performed otherwise.

At 10 a first sputtering or other deposition process is carried out to apply a transparent conductive material to the backing 1. A metal layer is then applied, again preferably by sputtering, at 11.

Position 12 represents application of a resist, for example by a continuous process such as roll printing, and subsequent etching to give the applied metal the desired bus configuration. The etching solution, which should be specific to the metal and substantially inert to the transparent conductive material, is washed away at 13.

A second resist is applied and second etching is carried out at 14. Hence the transparent conductive material is etched in an etchant that is substantially inert towards the metal. That etchant is washed away at 15. This last step is not always required as the metal may remain masked by its photoresist.

The final product may be supplied in the form of a roll, or it may be cut into separate panels as shown at 16. The roll 9 preferably has the width of 2 or more, say 2–10, panels, and operation 16 may also comprise lengthwise slitting.

The product of operations 10 and 11 may be useful for the production of many different panels, as regards bus and pixel configurations. Hence the coated backing at this stage may have a variety of different resists applied at positions 12 and 14.

The invention is further illustrated by the following Examples.

EXAMPLE 1

A polyester backing film was coated with indium tin oxide by sputtering. This was then coated with nickel. The resistivity of the nickel was 2 ohms/square, and that of the indium-tin oxide was 70 ohms/square. The first etching was carried out using 5% weight ferric chloride for 20 seconds, followed by a flowing water rinse. All the nickel not protected by a resist was removed, and the indium-tin oxide layer was not visibly changed. The effect on the indium tim oxide was tested by measuring its resistivity change after immersion of a part only thereof in the ferric chloride for 2 minutes. The resistivity increased by only 3%, confirming that the above 30 second immersion had no substantial effect.

A further, acid etching was carried out on the indium-tin oxide layer, followed by further water washing. A liquid crystal display was then formed using the resulting panel as one of the electrodes.

EXAMPLE 2

The above experiment was repeated, but using copper instead of nickel, and tin oxide instead of indium-tin oxide. The metal had a resistivity of 0.12 ohms per square, and the tin oxide 1100 ohms per square. In this case, all of the exposed metal (copper) was removed in 25 seconds. In a control experiment, analogous to the above, the tin oxide was substantially unchanged after immersion in the etching solution for 25 minutes.

EXAMPLE 3

In this example the metal layer was gold, at a resistivity of 1 ohm per square, and the etching solution was a 3% aqueous potassium iodide/iodine solution. The etching was complete in less than one minute. A control experiment showed that the conductive transparent layer, which was indium-tin oxide, was substantially unchanged after 10 minutes.

EXAMPLE 4

Here the material was aluminum, resistivity 3 ohm per square, and the conductive transparent layer was indium-tin oxide. Aqueous sodium hydroxide of pH 10 was used as the etching solution, and after 45 seconds all aluminum was removed.

EXAMPLE 5

In this example the conductive transparent layer was gold-tin oxide, but otherwise the features of Example 1 applied. The nickel was etched away where desired without substantially affecting the gold-tin oxide.

I claim:

1. A method of producing a transparent electrode, which comprises:
   (a) applying a transparent conductive material to a transparent thin film substrate;
   (b) applying a metal to the transparent conductive material;
   (c) then etching the metal to form one or more busses; and
   (d) optionally etching the transparent conductive material to form one or more elements connected to one or more of said busses.

2. A method according to claim 1, in which step (a) is carried out by a method that comprises sputtering.

3. A method according to claim 1, in which step (b) is carried out by a method that comprises sputtering.

4. A method according to claim 1, in which the backing comprises a flexible polymeric film.

5. A method according to claim 1, in which the metal comprises nickel, copper, gold, silver or aluminum.

6. A method according to claim 1, in which the transparent conductor comprises indium oxide, tin oxide, indium-tin oxide, or a transparent gold coating rendered substantially anti-reflective.

7. A method according to claim 1, in which busses by means of which the elements are activated consist essentially of metal applied in step (b).

8. A method according to claim 1, in which the thin film has a thickness of 25–200 micrometers.

9. An electrode for a visual display produced by a method according to claim 1.

10. A liquid crystal display comprising an electrode produced by a method according to claim 1, a panel, and a liquid crystal material therebetween.

11. A transparent touch panel comprising an electrode produced by a method according to claim 1 and a panel.

12. A method of producing a transparent electrode which method comprises:
   (a) applying a transparent conductive material to a transparent substrate;
   (b) applying a metal to the transparent conductive material;
   (c) then selectively etching the metal to form one or more busses; and
   (d) before or after step (c), etching the transparent conductive material to form one or more elements connected to one or more of said busses.

13. A method according to claim 12, in which step (d) is carried out after step (c).

14. A method according to claim 12, in which steps (c) and (d) are carried out over part of the surface of the substrate, and then a further etching step is carried out to expose elements of transparent conductive material.

15. A method according to claim 12, in which step (d) produces elements of area of at least 5 $mm^2$.

16. A method of producing a transparent electrode, having one or more elements each of area at least 5 $mm^2$, which comprises:
   (a) applying a transparent conductive material to a transparent substrate to form one or more elements of area of at least 5 $mm^2$;
   (b) applying a metal to the transparent conductive material; and
   (c) etching the metal to form one or more busses connected to the element or elements.

17. A method according to claim 16, in which said area is at least 30 $mm^2$.

* * * * *